United States Patent
Im et al.

(10) Patent No.: US 9,543,519 B2
(45) Date of Patent: Jan. 10, 2017

(54) DEPOSITION APPARATUS AND METHOD OF MANUFACTURING ORGANIC LIGHT-EMITTING DISPLAY APPARATUS

(71) Applicant: Samsung Display Co., Ltd., Yongin, Gyeonggi-Do (KR)

(72) Inventors: Sungsoon Im, Yongin (KR); Taewook Kang, Yongin (KR); Duckjung Lee, Yongin (KR)

(73) Assignee: Samsung Display Co., Ltd., Gyeonggi-Do (KR)

(*) Notice: Subject to any disclaimer, the term of this patent is extended or adjusted under 35 U.S.C. 154(b) by 0 days.

(21) Appl. No.: 14/596,653

(22) Filed: Jan. 14, 2015

(65) Prior Publication Data
US 2016/0049587 A1 Feb. 18, 2016

(30) Foreign Application Priority Data
Aug. 12, 2014 (KR) ........................ 10-2014-0104530

(51) Int. Cl.
*H01L 51/00* (2006.01)
*H01L 51/56* (2006.01)
*H01L 27/32* (2006.01)

(52) U.S. Cl.
CPC ........... *H01L 51/0013* (2013.01); *H01L 51/56* (2013.01); *H01L 27/3211* (2013.01); *H01L 2227/323* (2013.01)

(58) Field of Classification Search
None
See application file for complete search history.

(56) References Cited

U.S. PATENT DOCUMENTS

| 2002/0160296 A1* | 10/2002 | Wolk | B41M 5/265 |
| | | | 430/200 |
| 2009/0075411 A1* | 3/2009 | Yamazaki | C23C 14/12 |
| | | | 438/29 |
| 2009/0104835 A1 | 4/2009 | Aoyama et al. | |

(Continued)

FOREIGN PATENT DOCUMENTS

| JP | 2009-164197 A | 7/2009 |
| KR | 10-2013-0099686 A | 9/2013 |
| KR | 10-2013-0125161 A | 11/2013 |

*Primary Examiner* — Johannes P Mondt
(74) *Attorney, Agent, or Firm* — Knobbe Martens Olson & Bear LLP

(57) ABSTRACT

Provided are a deposition apparatus and a method of manufacturing an organic light-emitting display (OLED) apparatus, which are capable of reducing manufacturing time and manufacturing costs of the OLED apparatus. The method includes: turning a substrate such that a deposition surface of the substrate faces upward; depositing a first deposition layer on a deposition surface of a first donor mask while the deposition surface of the first donor mask faces downward; arranging the first donor mask and the substrate such that the first donor mask is above the substrate while the first deposition layer faces downward and the deposition surface of the substrate faces upward; depositing, on the deposition surface of the substrate, a part of the first deposition layer of the deposition surface of the first donor mask; and turning the substrate such that the deposition surface of the substrate faces downward.

10 Claims, 7 Drawing Sheets

(56) References Cited

U.S. PATENT DOCUMENTS

| | | | |
|---|---|---|---|
| 2009/0226610 A1* | 9/2009 | Koenig | C23C 14/042 427/248.1 |
| 2009/0286447 A1* | 11/2009 | Kobayashi | C23C 14/042 445/58 |
| 2009/0325451 A1* | 12/2009 | Higo | H01L 51/0013 445/24 |
| 2013/0225028 A1 | 8/2013 | Yi | |

\* cited by examiner

DEPOSITION APPARATUS AND METHOD OF MANUFACTURING ORGANIC LIGHT-EMITTING DISPLAY APPARATUS

RELATED APPLICATION

This application claims the benefit of Korean Patent Application No. 10-2014-0104530, filed on Aug. 12, 2014, in the Korean Intellectual Property Office, the disclosure of which is incorporated herein in its entirety by reference.

BACKGROUND

1. Field

One or more embodiments of the present invention relate to a deposition apparatus and a method of manufacturing an organic light-emitting display (OLED) apparatus, and more particularly, to a deposition apparatus and a method of manufacturing an OLED apparatus, wherein manufacturing processes and manufacturing costs of the OLED apparatus may be reduced.

2. Description of the Related Art

Generally, an organic light-emitting display (OLED) apparatus is a display apparatus that includes organic light-emitting device in a display region. The organic light-emitting device includes a pixel electrode, a counter electrode opposing the pixel electrode, and an intermediate layer disposed between the pixel electrode and the counter electrode and including an emission layer. While manufacturing the OLED apparatus, any method may be used to form the emission layer, such as a deposition method or an inkjet printing method.

However, generally, in such method or apparatus for manufacturing the OLED apparatus, several operations are performed while forming the intermediate layer including the emission layer, and thus manufacturing costs and manufacturing time may increase.

SUMMARY

One or more embodiments of the present invention include a deposition apparatus and a method of manufacturing an organic light-emitting display (OLED) apparatus, which are capable of reducing manufacturing time and manufacturing costs of the OLED apparatus.

Additional aspects will be set forth in part in the description which follows and, in part, will be apparent from the description, or may be learned by practice of the presented embodiments.

One aspect of the invention provides a method of manufacturing an organic light-emitting display (OLED) apparatus, the method comprising: providing a substrate comprising a first surface facing generally downward and a second surface facing generally upward, wherein a pre-deposited layer is formed over the first surface; turning the substrate over such that a first surface of the substrate faces generally upward; depositing a first deposition material on a deposition surface of a first donor mask while the deposition surface of the first donor mask faces generally downward, thereby forming a first donor layer on the deposition surface of the first donor mask; arranging the first donor mask and the substrate such that the first donor mask is disposed above the substrate while the deposition surface of the first donor mask faces generally downward and the first surface of the substrate faces generally upward; transferring, over the first surface of the substrate, at least part of the first deposition material of the first donor layer, thereby forming a first deposition layer over the first surface of the substrate; and turning the substrate back such that the first surface of the substrate faces generally downward.

In the foregoing method, at any time after depositing and before transferring, the first donor mask may maintain its orientation that the deposition surface of the first donor mask faces generally downward. At any time after depositing and before transferring, the first donor mask is not turned over. Once turning the substrate over such that a first surface of the substrate faces generally upward, the substrate is not turned over until turning the substrate back such that the first surface of the substrate faces generally downward.

Still in the foregoing method, the first deposition layer may comprise an array of organic light emitting layer portions. Providing the substrate may comprise transmitting a pre-deposition material from a pre-deposition material source located under the substrate toward the first surface of the substrate while the first surface faces generally downward. Depositing the first deposition material may comprise transmitting the first deposition material from a first deposition material source located under the first donor mask toward the deposition surface of the first donor mask. Transferring may comprise emitting a laser beam or a flash lamp light to a surface of the first donor mask, which is opposite to the deposition surface of the first donor mask, to transfer the at least part of the first deposit material of the first donor layer over the first surface of the substrate.

Yet in the foregoing method, the method may further comprise: depositing a second deposition material on a deposition surface of a second donor mask while the deposition surface of the second donor mask faces generally downward, thereby forming a second donor layer on the deposition surface of the second donor mask; arranging the second donor mask and the substrate such that the second donor mask is disposed above the substrate while the deposition surface of the second donor mask faces generally downward and the first surface of the substrate faces generally upward; prior to turning the substrate back such that the first surface of the substrate faces generally downward, transferring, over the first surface of the substrate, at least a part of the second deposition material of the second donor layer, thereby forming a second deposition layer over the first surface of the substrate. At any time after depositing the second deposition material and before transferring the at least part of the second deposition material, the second donor mask may maintain its orientation that the deposition surface of the second donor mask faces generally downward. At any time after depositing the second deposition material and before transferring the at least part of the second deposition material, the second donor mask is not turned over. Once turning the substrate over such that a first surface of the substrate faces generally upward, the substrate is not turned over until turning the substrate back such that the first surface of the substrate faces generally downward. The first deposition layer may comprise a first array of organic light emitting layer portions configured to emit light of a first color, wherein the second deposition layer comprises a second array of organic light emitting layer portions configured to emit light of a second color different from the first color.

Further in the foregoing method, the method may further comprise: depositing a third deposition material on a deposition surface of a third donor mask while the deposition surface of the third donor mask faces generally downward, thereby forming a third donor layer on the deposition surface of the second donor mask; arranging the third donor mask and the substrate such that the third donor mask is disposed above the substrate while the deposition surface of the third donor mask faces generally downward and the first surface of the substrate faces generally upward; and prior to turning the substrate back such that the first surface of the substrate faces generally downward, transferring, over the first surface of the substrate, at least part of the third deposition material of the third donor layer, thereby forming a third deposition layer over the first surface of the substrate. At any time after depositing the third deposition material and before transferring the at least part of the third deposition material, the third donor mask maintains its orientation that the deposition surface of the second donor mask faces generally downward. At any time after depositing the second deposition material and before transferring the at least part of the second deposition material, the third donor mask is not turned over. Once turning the substrate over such that a first surface of the substrate faces generally upward, the substrate is not turned over until turning the substrate back such that the first surface of the substrate faces generally downward. The first deposition layer comprises a first array of organic light emitting layer portions configured to emit light of a first color, wherein the second deposition layer comprises a second array of organic light emitting layer portions configured to emit light of a second color different from the first color, wherein the third deposition layer comprises a third array of organic light emitting layer portions configured to emit light of a third color different from the first and second colors.

Another aspect of the invention provides a deposition apparatus comprising: a first substrate turning chamber configured to receive a substrate that comprises a first surface and a second surface facing away from the first surface, and further configured to turn the substrate over such that the first surface faces generally upward; a first deposition cluster connected to the first substrate turning chamber to receive the substrate transferred from the first substrate turning chamber, the first deposition cluster comprising: a first mask deposition chamber configured to deposit a first deposition material on a first donor mask such that a first donor layer is formed on the first donor mask, and a first substrate deposition chamber configured to transfer at least part of the first deposition material of the first donor layer over the first surface of the substrate such that a first deposition layer is formed over the first surface; a second deposition cluster connected to the first deposition cluster to receive the substrate transferred from the first deposition cluster, the second deposition cluster comprising: a second mask deposition chamber configured to deposit a second deposition material on a second donor mask such that a second donor layer is formed on the second donor mask, and a second substrate deposition chamber configured to transfer at least part of the second deposition material of the second donor layer over the first surface of the substrate such that a second deposition layer is formed over the first surface of the substrate; and a second substrate turning chamber connected to the second deposition cluster, configured to receive the substrate transferred from the second deposition cluster, and further configured to turn the substrate back such that the first surface faces generally downward, wherein the first deposition cluster does not comprise any device configured to turn the first donor mask over, wherein the second deposition cluster does not comprise any device configured to turn the second donor mask over. The apparatus does not comprise any device disposed between the first and second substrate turning chambers and configured to turn the substrate over.

According to one or more embodiments of the present invention, a deposition apparatus includes: a first substrate turning chamber; a first deposition cluster that is connected to the first substrate turning chamber and includes a first transfer chamber, a first mask stack connected to the first transfer chamber, a first mask deposition chamber connected to the first transfer chamber, and a first substrate deposition chamber connected to the first transfer chamber; a second deposition cluster that is connected to the first transfer chamber and includes a second transfer chamber, a second mask stack connected to the second transfer chamber, a second mask deposition chamber connected to the second transfer chamber, and a second substrate deposition chamber connected to the second transfer chamber; a third deposition cluster that is connected to the second transfer chamber and includes a third transfer chamber, a third mask stack connected to the third transfer chamber, a third mask deposition chamber connected to the third transfer chamber, and a third substrate deposition chamber connected to the third transfer chamber; and a second substrate turning chamber connected to the third deposition cluster.

In the first substrate deposition chamber, one side may be connected to the first substrate turning chamber and another side may be connected to the first transfer chamber, in the second substrate deposition chamber, one side may be connected to the first transfer chamber and another side may be connected to the second transfer chamber, and in the third substrate deposition chamber, one side may be connected to the second transfer chamber and another side may be connected to the third transfer chamber.

In the first substrate deposition chamber, one side may be connected to the first transfer chamber and another side may be connected to the second transfer chamber, in the second substrate deposition chamber, one side may be connected to the second transfer chamber and another side may be connected to the third transfer chamber, and in the third substrate deposition chamber, one side may be connected to the third transfer chamber and another side may be connected to the second substrate turning chamber.

The first substrate turning chamber may turn a substrate such that a deposition surface of the substrate faces upward, and the second substrate turning chamber may turn the substrate such that the deposition surface of the substrate faces downward.

The first mask stack, the second mask stack, and the third mask stack may each store a donor mask such that a deposition surface of the donor mask faces downward, the first mask deposition chamber, the second mask deposition chamber, and the third mask deposition chamber may each deposit a deposition layer on the deposition surface of the donor mask, and the first substrate deposition chamber, the second substrate deposition chamber, and the third substrate deposition chamber may each deposit, on the deposition surface of the substrate, a part of the deposition layer on the deposition surface of the donor mask by locating the donor mask above the substrate.

Each of the substrate deposition chambers may deposit a pre-set part of the deposition or donor layer on the deposition surface of the substrate by emitting a laser beam or a flash light to a surface of the donor mask, which faces away from the deposition layer.

The deposition apparatus may further include a first auxiliary layer deposition chamber that is connected to the first substrate turning chamber and deposits a first auxiliary layer on the substrate while the deposition surface of the substrate faces downward, or a first auxiliary layer deposition cluster that includes the first auxiliary layer deposition chamber.

Alternatively, the deposition apparatus may further include a second auxiliary layer deposition chamber that is connected to the second substrate turning chamber and deposits a second auxiliary layer on the substrate while the deposition surface of the substrate faces downward, or a second auxiliary layer deposition cluster that includes the second auxiliary layer deposition chamber.

According to one or more embodiments of the present invention, a method of manufacturing an organic light-emitting display (OLED) apparatus, the method includes: turning a substrate such that a deposition surface of the substrate faces upward; depositing a first deposition layer on a deposition surface of a first donor mask while the deposition surface of the first donor mask faces downward; aligning the first donor mask and the substrate such that the first donor mask is above the substrate while the first deposition layer faces downward and the deposition surface of the substrate faces upward; depositing, on the deposition surface of the substrate, a part of the first deposition layer on the deposition surface of the first donor mask; and turning the substrate such that the deposition surface of the substrate faces downward.

The depositing on the deposition surface of the substrate may include emitting a laser beam or a flash lamp light to a surface of the first donor mask, which faces away from the deposition surface of the first donor mask, to deposit a pre-set part of the first deposition layer on the deposition surface of the substrate.

The method may further include: depositing a second deposition layer on a deposition surface of a second donor mask while the deposition surface of the second donor mask faces downward; aligning the second donor mask and the substrate such that the second donor mask is above the substrate while the second deposition layer faced downward and the deposition surface of the substrate faces upward; depositing, on the deposition surface of the substrate, a part of the second deposition layer of the deposition surface of the second donor mask; depositing a third deposition layer on a deposition surface of a third donor mask while the deposition surface of the third donor mask faces downward; aligning the third donor mask and the substrate such that the third donor mask is above the substrate while the third deposition layer faces downward and the deposition surface of the substrate faces upward; and depositing, on the deposition surface of the substrate, a part of the third deposition layer of the deposition surface of the third donor mask, wherein the turning of the substrate such that the deposition surface of the substrate faces downward may be performed after the depositing of the part of the first deposition layer, the depositing of the part of the second deposition layer, and the depositing of the part of the third deposition layer.

The method may further include: depositing a first auxiliary layer on the deposition surface of the substrate by using a deposition source located below the substrate while the deposition surface of the substrate faces downward; and depositing a second auxiliary layer on the deposition surface of the substrate by using another deposition source located below the substrate while the deposition surface of the substrate faces downward, wherein the depositing of the first auxiliary layer may be performed before the turning of the substrate such that the deposition surface of the substrate faces upward, and the depositing of the second auxiliary layer may be performed after the turning of the substrate such that the deposition surface of the substrate faces downward.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
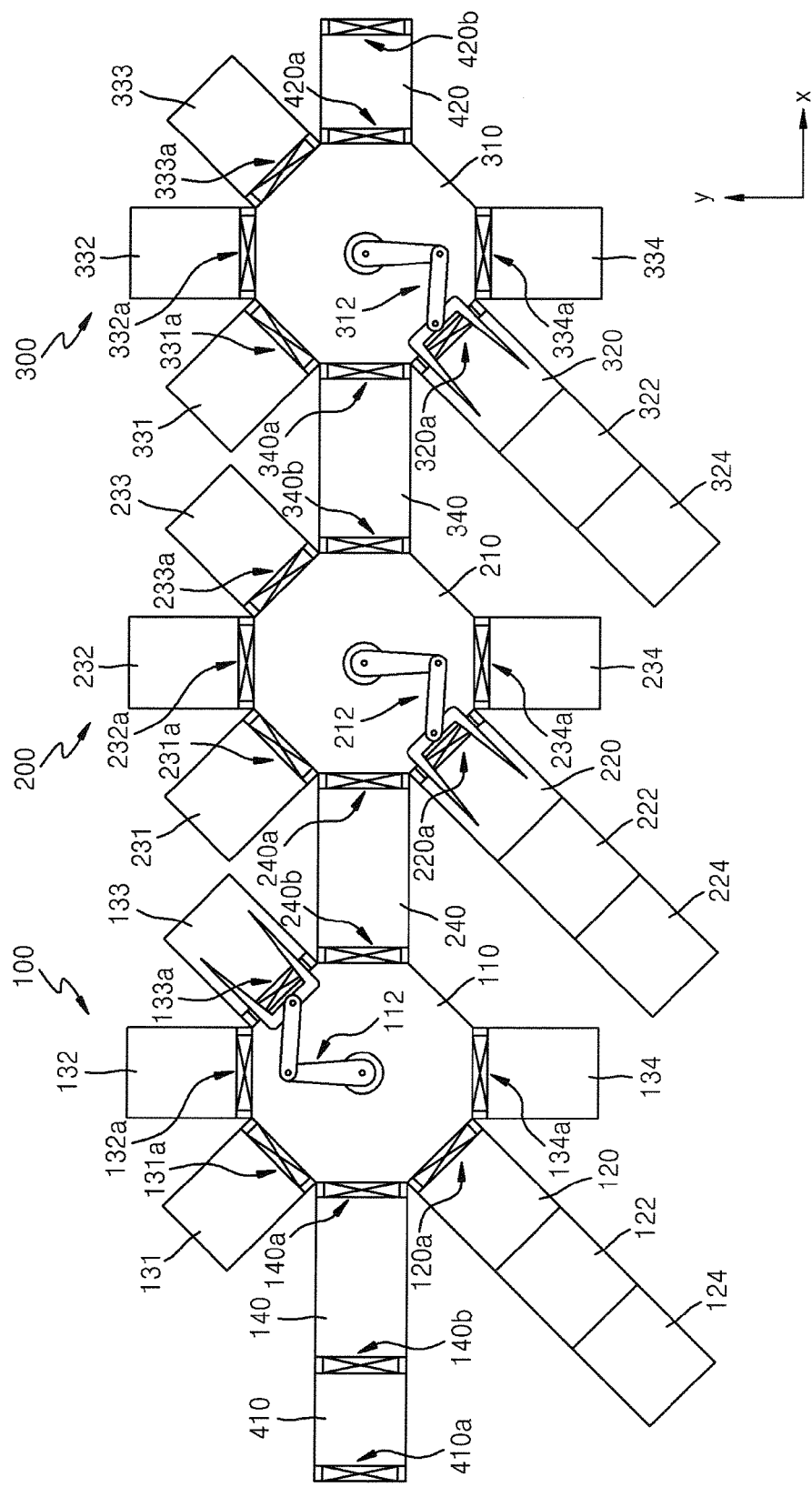
FIG. 1 is a plan view schematically illustrating a deposition apparatus according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view schematically illustrating a deposition apparatus according to an embodiment of the present invention. As shown in FIG. 1, the deposition apparatus according to the current embodiment includes a first deposition cluster 100, a second deposition cluster 200, a third deposition cluster 300, a first substrate turning chamber 410, and a second substrate turning chamber 420.

The deposition apparatus according to the current embodiment is an apparatus that deposits a layer that is patterned and formed without being integrally formed with respect to entire pixels, from among layers disposed between a pixel electrode and a counter electrode of an organic light-emitting display (OLED) apparatus. For example, the deposition apparatus may deposit a red light emission layer, a green light emission layer, and a blue light emission layer. Thus, as shown in FIG. 2, before a substrate 10 is put into the deposition apparatus, pre-deposited layers, for example, a pixel electrode 21, a pixel-defining film 18, etc. may be formed on the substrate 10, and a layer that is integrally formed with respect to entire pixels may be formed on the pixel electrode 21 and the pixel-defining film 18.

Figure 2:
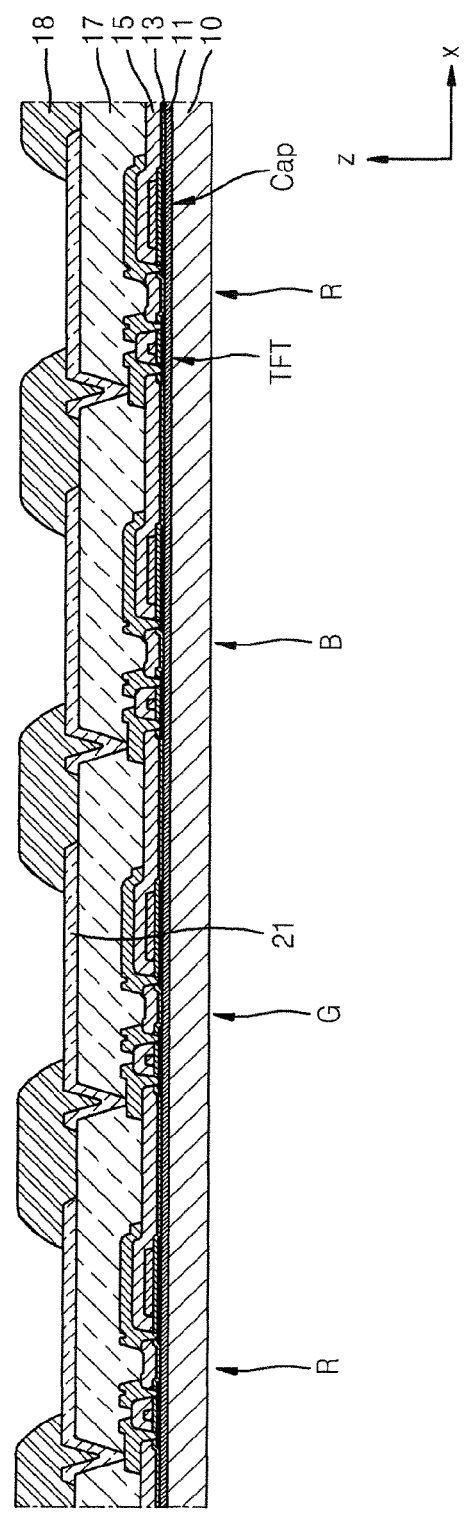
FIGS. 2 through 5 are cross-sectional views for describing a method of manufacturing an organic light-emitting display (OLED) apparatus, according to an embodiment of the present invention.

In addition, in FIG. 2, a thin-film transistor TFT or a capacitor Cap is formed on the substrate 10, and other components, such as a buffer layer 11 that prevents impurities from penetrating into a semiconductor layer of the thin-film transistor TFT, a gate insulating film 13 that insulates the semiconductor layer and a gate electrode of the thin-film transistor TFT, an interlayer insulating film 15 that insulates the gate electrode and source and drain electrodes of the thin-film transistor TFT, and a planarization film 17 that covers the thin-film transistor TFT and has a roughly flat top surface, may be formed on the substrate 10.

Meanwhile, a layer integrally formed with respect to entire pixels before an emission layer is formed may be referred to as a first auxiliary layer, and the first auxiliary layer may be a hole injection layer (HIL) and/or a hole transport layer (HTL).

In embodiments, the first auxiliary layer or a pre-deposited layer may be formed via a deposition method, and the first auxiliary layer may be deposited while a deposition source discharging a material for forming the first auxiliary layer is below the substrate 10 and a deposition surface of the substrate 10 faces the deposition source. Thus, unlike shown in FIG. 2, the pixel electrode 21, etc. of the substrate 10 face downward while the first auxiliary layer is formed on the substrate 10. Then, when the substrate 10 is put into the first substrate turning chamber 410 of the deposition apparatus according to the current embedment, the first substrate turning chamber 410 turns the substrate 10 such that the pixel electrode 21, etc. face upward as shown in FIG. 2. As such, the first substrate turning chamber 410 turns the substrate 10 such that the deposition surface of the substrate 10 faces upward in the first deposition cluster 100.

When the first substrate turning chamber 410 turns the substrate 10, an inner region of the first substrate turning chamber 410 may be in an atmospheric state or a state having a pre-set vacuum level. In any cases, the inner region of the first substrate turning chamber 410 may be blocked from an outer region of the first substrate turning chamber 410 through a gate 410a of the first substrate turning chamber 410. Here, any device for fixing the substrate 10 may be used to turn the substrate 10, such as a vacuum pad or an electrostatic chuck, or the substrate 10 may be fixed on a susceptor by using a clamp.

The first deposition cluster 100 includes a first mask stack 120, a plurality of first mask deposition chambers 131, 132, 133, 134, a first substrate deposition chamber 140, and a first transfer chamber 110 located approximately at the center of the first deposition cluster 110 and connected to the first mask stack 120, the plurality of first mask deposition chambers 131, 132, 133, 134, and the first substrate deposition chamber 140. The first transfer chamber 110 may include a first transfer robot 112 having an end-effector. The first transfer robot 112 may discharge a first donor mask accommodated in the first mask stack 120 or put the first donor mask into the first mask stack 120, put or discharge the first donor mask into or from the plurality of first mask deposition chambers 131, 132, 133, 134 and the first substrate deposition chamber 140, and discharge the substrate 10 from the first substrate deposition chamber 140.

The first mask stack 120 may accommodate a plurality of the first donor masks. The first donor mask accommodated in the first mask stack 120 may have a structure shown in FIG. 3. In embodiments, a first donor mask 30 may include a base substrate 310, a reflection layer 32, and a photothermal converting layer 33.

The base substrate 31 forms an overall outer shape of the first donor mask 30, and may be formed of glass so as to transmit light to the photothermal converting layer 33. Alternatively, as occasion demands, the base substrate 31 may be formed of polyester such as polyethylene terephthalate (PET), polyacryl, polyepoxy, polyethylene and/or polystyrene.

The photothermal converting layer 33 is a layer that absorbs a flash lamp light or a laser beam and converts at least a part of energy of the absorbed flash lamp light or laser beam to heat. The photothermal converting layer 33 may be a film formed of a metal such as aluminum or silver, which is capable of absorbing a light in an infrared-visible ray region, an oxide or sulfide film of the metal, or a polymer organic film containing carbon black or graphite.

The reflection layer 32 may be disposed between the base substrate 31 and the photothermal converting layer 33. The reflection layer 32 includes a plurality of through holes h. Accordingly, the reflection layer 32 has a transmission areas TA corresponding to the through holes h, and block areas BA corresponding to areas other than the through holes h.

The reflection layer 32 may be formed on the base substrate 31 to have the through holes h by using a mask or by forming a layer having a uniform thickness and then removing some of the layer. The reflection layer 32 may be formed of titanium (Ti), aluminum (Al), copper (Cu), silver (Ag), molybdenum (Mo), or an alloy thereof, or chromium nitride (CrN) or TiAlCu. Alternatively, the reflection layer 32 may be formed of titanium oxide (TiOx), silicon oxide (SiOx), or silicon carbon nitride (SiCN).

The first donor mask 30 may be accommodated in the first mask stack 120 while the base substrate 31 is located at the top and the photothermal converting layer 33 is located at the bottom, and while a deposition surface of the first donor mask 30 faces downward.

The first donor mask 30 accommodated in the first mask stack 120 may be discharged by the first transfer robot 112 and put into any one of the first mask deposition chambers 131, 132, 133, 134. As occasion demands, a gate 120a may exist between the first mask stack 120 and the first transfer chamber 110. For example, the first mask stack 120 may be in an atmospheric state and the gate 120a may be opened such that the first transfer chamber 110 may also be in a similar state as the first mask stack 120. Then, after the first transfer robot 112 discharges the first donor mask 30 from the first mask stack 120 to the first transfer chamber 110, the gate 120a may be closed and an inner region of the first transfer chamber 110 may be in a state having a pre-set vacuum level.

The first transfer robot 112 puts the first donor mask 30 discharged from the first mask stack 120 into any one of the first mask deposition chambers 131, 132, 133, 134. For example, the first transfer robot 112 may put the first donor mask 30 into the first mask deposition chamber 133.

At this time, the first donor mask 30 is not turned over. Thus, in the first donor mask 30 put into the first mask deposition chamber 133, the base substrate 31 is located at the top and the photothermal converting layer 33 is located at the bottom. In embodiments, it is possible that the first deposition cluster does not include any device configured to turn the first donor mask over.

Figure 3:
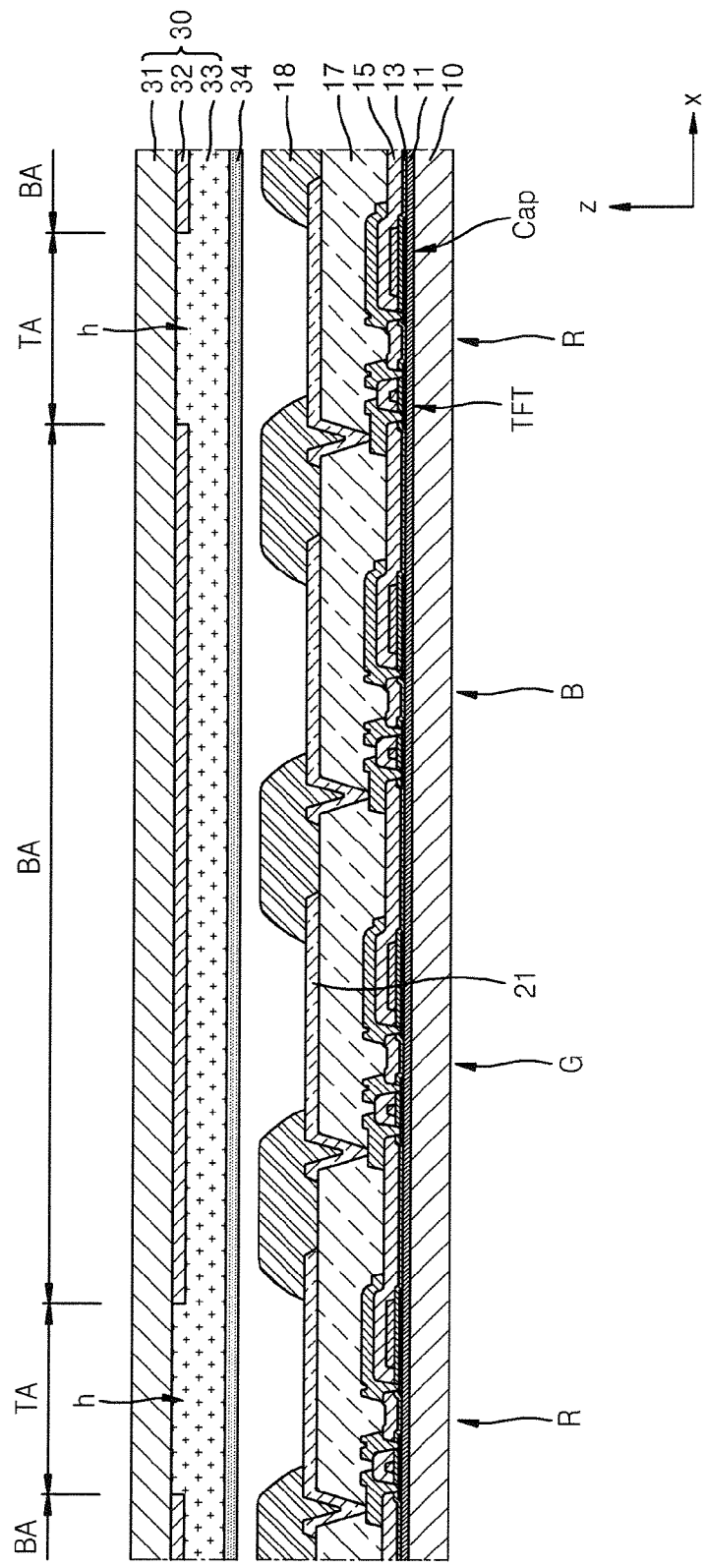

The first mask deposition chambers 131, 132, 133, 134 may deposit a first deposition material to form a deposition layer or a donor layer 34 of FIG. 3 on the deposition surface of the first donor mask 30, for example, a surface of the photothermal converting layer 33, which is opposite to a surface facing the base substrate 310. In embodiments, the deposition layer 34 may be formed on the deposition surface of the first donor mask 30 by using a deposition source located below the first donor mask 30 while the deposition surface of the first donor mask 30 faces downward. The first mask deposition chambers 131, 132, 133, 134 may form the deposition layer 34 on the first donor mask 30 while inner regions of the first mask deposition chambers 131, 132, 133, 134 are in a state having a pre-set vacuum level. At this time, the deposition layer 34 may be a red light emission layer.

When the first transfer robot 112 puts the first donor mask 30 into the first mask deposition chamber 133, a gate 133a may be opened and the first donor mask 30 may be put into the first mask deposition chamber 133. Here, since the inner region of the first transfer chamber 110 maintains the pre-set vacuum level before the gate 133a is opened, the inner region of the first mask deposition chamber 133 almost maintains the pre-set vacuum level even when the gate 133a opens.

After the deposition layer 34 is deposited on the deposition surface of the first donor mask 30 in the first mask deposition chamber 133, the first donor mask 30 is again discharged into the first transfer chamber 110 by the first transfer robot 112. At this time as well, the gate 133a is opened and then closed. Other gates 131a, 132a, and 134a may have the similar or same function as the gate 133a.

One side of the first substrate deposition chamber 140 in a −x direction is connected to the first substrate turning chamber 410 and another side of the first substrate deposition chamber 140 in a +x direction is connected to the first transfer chamber 110.

The first donor mask 30 in the first transfer chamber 110 may be put into the first substrate deposition chamber 140 by the first transfer robot 112. At this time, a gate 140a may be opened and closed. Also, the substrate 10 may be turned by the first substrate turning chamber 410 such that the deposition surface of the substrate 10 faces upward is put into the first substrate deposition chamber 140. At this time, a gate 140b may be opened and closed. The substrate 10 is not put into the first substrate deposition chamber 140 by the first transfer robot 112, but by a transfer rail between the first substrate turning chamber 410 and the first substrate deposition chamber 140. In embodiments, it is possible that the deposition apparatus does not include any device disposed between the first and second substrate turning chambers 410 and 420 and configured to turn the substrate over.

Here, the substrate 10 may be put into the first substrate deposition chamber 140 after the first donor mask 30 is put into the first substrate deposition chamber 140, or the first donor mask 30 may be put into the first substrate deposition chamber 140 after the substrate 10 is put into the first substrate deposition chamber 140. Alternatively, the first donor mask 30 and the substrate 10 may be simultaneously put into the first substrate deposition chamber 140.

As such, when the substrate 10 and the first donor mask 30 are put into the first substrate deposition chamber 140, the first donor mask 30 is above the substrate 10 while the deposition layer 34 of the first donor mask 30 faces downward (−z direction) and the deposition surface of the substrate 10 faces upward (+z direction), as shown in FIG. 3.

Then, the first substrate deposition chamber 140 mutually aligns the first donor mask 30 and the substrate 10. In embodiments, the substrate 10 and the first donor mask 30 are arranged such that the transmission area TA of the reflection layer 32 of the first donor mask 30 corresponds to a pre-set area of the substrate 10. In FIG. 3, since the deposition layer 34 of the first donor mask 30 contains a red emission material, the substrate 10 and the first donor mask 30 are aligned such that the through hole h of the reflection layer 32 of the first donor mask 30 corresponds to the pixel electrode 21 of a red sub-pixel R.

Figure 4:
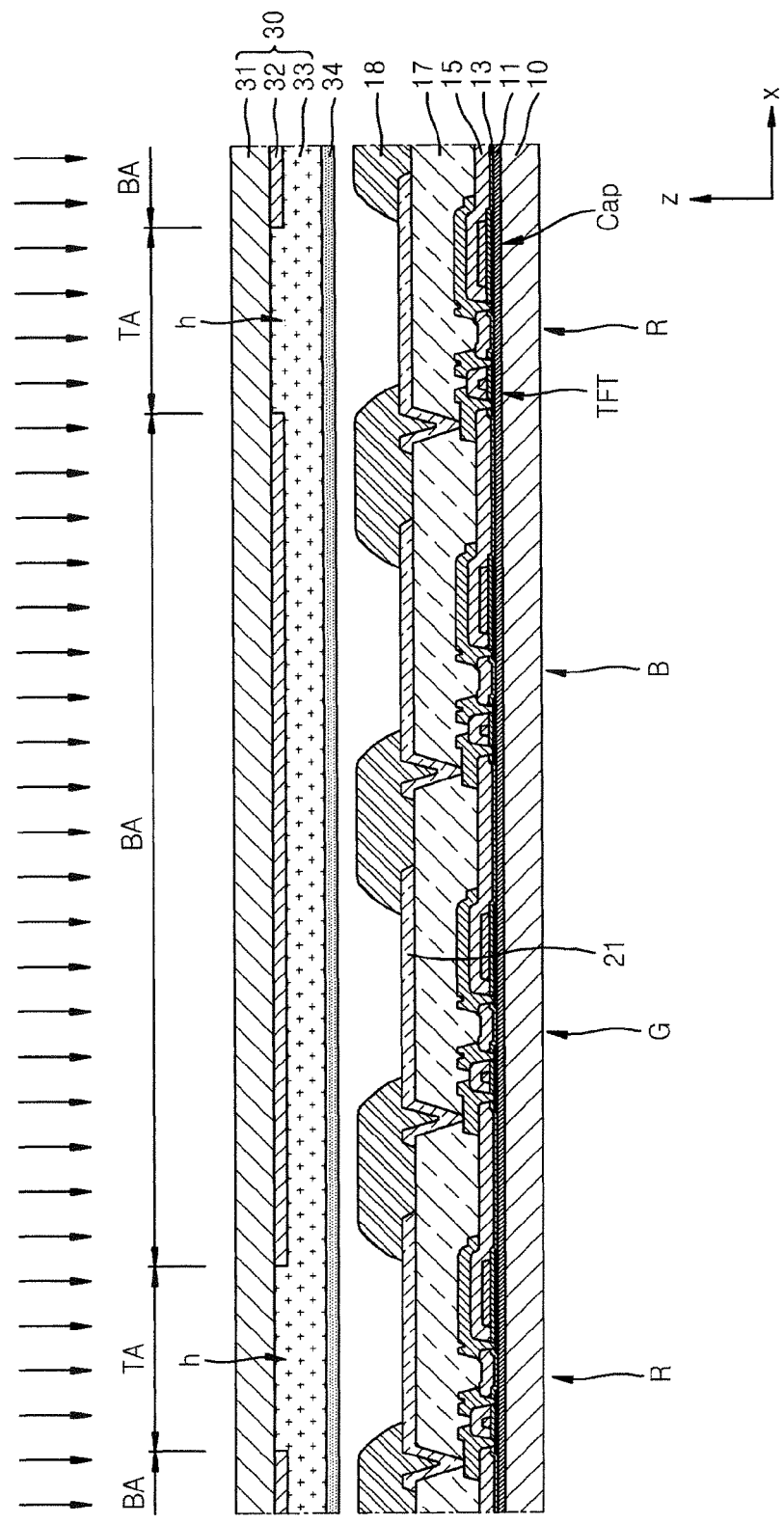

Then, the first substrate deposition chamber 140 deposits, on the deposition surface of the substrate 10, a part of the deposition or donor layer 34 of the first deposition material on the deposition surface of the first donor mask 30. In detail, as shown in FIG. 4, the part of the deposition layer 34 of the first donor mask 30 is deposited or transferred on the substrate 10 by emitting a lamp light or a laser beam to the first donor mask 30 by using a flash lamp or a laser beam generator.

Figure 5:
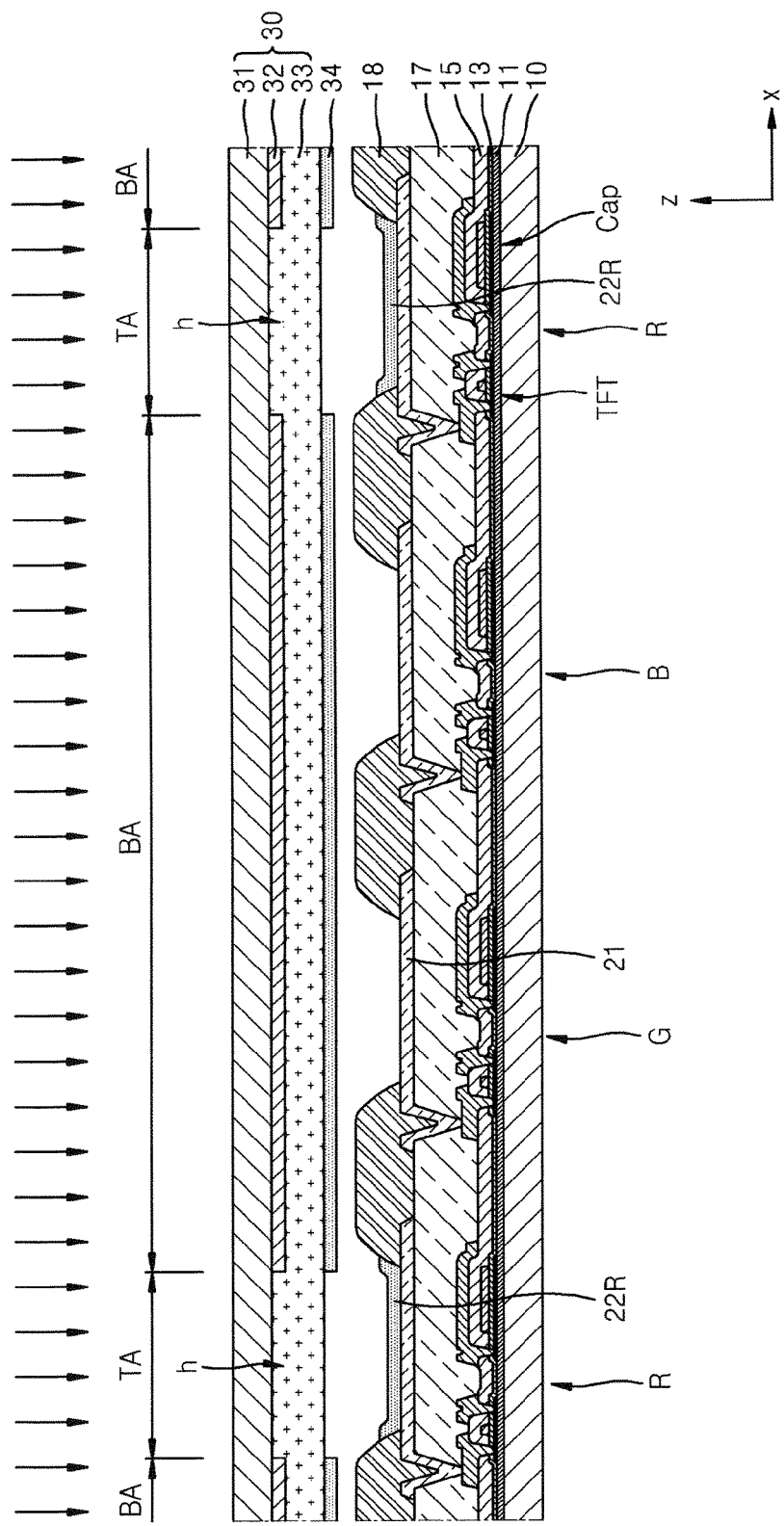

In detail, the lamp light or laser beam is emitted to a surface of the first donor mask 30, which faces away from the deposition surface of the first donor mask 30. Here, even if the lamp light or laser beam is emitted to an entire surface of the first donor mask 30, the lamp light or laser beam is mostly blocked by the reflection layer 32 and reaches the photothermal converting layer 33 only through the transmission area TA corresponding to the through hole h of the reflection layer 32. Accordingly, only an area of the deposition layer 34 of the first donor mask 30, which corresponds to the transmission area TA, evaporates, vaporizes, or sublimates, and thus a red light emission layer 22R is formed only in the pixel electrode 21 of the red sub-pixel R as shown in FIG. 5.

Here, the lamp light or laser beam is emitted to the first donor mask 30 while the deposition layer 34 of the first donor mask 30 and the deposition surface of the substrate 10 are very closely disposed to each other. Thus, even if the substrate 10 is located at the bottom and the first donor mask 30 is located above the substrate 10, the pre-set area of the deposition layer 34 on the first donor mask 30 may be easily deposited on the substrate 10.

For reference, when the first auxiliary layer is deposited on the substrate 10 or the deposition layer 34 is formed on the first donor mask 30, a patterned layer is not formed but an integral layer is formed with respect to the entire substrate 10 or first donor mask 30. In this case, if a distance between the deposition source and the deposition surface is too close, it may be difficult to form the first auxiliary layer or the deposition layer 34 in a uniform thickness. Thus, at least a pre-set distance may be maintained between the deposition source and the deposition surface, and in this case, the first auxiliary layer or the deposition layer 34 may be satisfactorily deposited if the deposition source is below the deposition surface of the substrate 10.

Then, the first transfer robot 112 discharges the first donor mask 30 from the first substrate deposition chamber 140 and puts the first donor mask 30 into the first mask stack 120. The first donor mask 30 used as such may be washed in a washing chamber 124, tested in a test chamber 122 as occasion demands, and then put into the first mask stack 120 again to be re-used. Here, the first donor mask 30 may be re-used by, as described above, forming the deposition layer 34 on the first donor mask 30 and then depositing the part of the deposition layer 34 on the substrate 10.

Meanwhile, as shown in FIG. 5, the substrate 10 on which the red light emission layer 22R is deposited may also be discharged from the first substrate deposition chamber 140 to the first transfer chamber 110 by the first transfer robot 112, and then put into the second deposition cluster 200. In detail, the substrate 10 may be put into a second substrate deposition chamber 240 of the second deposition cluster 200. At this time, the substrate 10 moves while the deposition surface of the substrate 10 faces upward (+z direction).

The second deposition cluster 200 includes a second mask stack 220, a plurality of second mask deposition chambers 231, 232, 233, 234, the second substrate deposition chamber 240, and a second transfer chamber 210 that is located approximately at the center of the second deposition cluster 200 and is connected to the second mask stack 220, the plurality of second mask deposition chambers 231, 232, 233, 234, and the second substrate deposition chamber 240. The second transfer chamber 210 may include a second transfer robot 212 having an end-effector. The second transfer robot 212 may discharge a second donor mask accommodated in the second mask stack 220 or put the second donor mask into the second mask stack 220, put or discharge the second donor mask into or from the second mask deposition chambers 231, 232, 233, 234 and the second substrate deposition chamber 240, and discharge the substrate 10 from the second substrate deposition chamber 240.

The second mask stack 220 may accommodate a plurality of the second donor masks. A structure of the second donor mask accommodated in the second mask stack 220 may be the same and/or similar to that of the first donor mask 30 described above. The second donor mask may be accommodated in the second mask stack 220 while a deposition surface of the second donor mask faces downward.

The second donor mask accommodated in the second mask stack 220 may be discharged by the second transfer robot 212 and put into any one of the second mask deposition chambers 231, 232, 233, 234. As occasion demands, a gate 220*a* may exist between the second mask stack 220 and the second transfer chamber 210. For example, the second mask stack 220 may be in an atmospheric state and the gate 220*a* may be opened such that the second transfer chamber 210 may also be in a similar state as the second mask stack 220. Then, after the second transfer robot 212 discharges the second donor mask from the second mask stack 220 to the second transfer chamber 210, the gate 220*a* may be closed and an inner region of the second transfer chamber 210 may be in a state having a pre-set vacuum level.

The second transfer robot 212 puts the second donor mask discharged from the second mask stack 220 into any one of the second mask deposition chambers 231, 232, 233, 234. For example, the second transfer robot 212 may put the second donor mask into the second mask deposition chamber 233.

At this time, the second donor mask is not turned. Thus, in the second donor mask put into the second mask deposition chamber 233, a base substrate is located at the top and a photothermal converting layer is located at the bottom. In embodiments, it is possible that the second deposition cluster does not include any device configured to turn the first donor mask over.

The second mask deposition chambers 231, 232, 233, 234 may deposit a second deposition material to form a deposition layer or a donor layer on the deposition surface of the second donor mask, for example, a surface of the photothermal converting layer, which is opposite to a surface facing the base substrate. In embodiments, the deposition layer may be formed on the deposition surface of the second donor mask by using a deposition source located below the second donor mask while the deposition surface of the second donor mask faces downward. The second mask deposition chambers 231, 232, 233, 234 may form the deposition layer on the second donor mask while inner regions of the second mask deposition chambers 231, 232, 233, 234 are in a state having a pre-set vacuum level. At this time, the deposition layer may be a green light emission layer.

When the second transfer robot 212 puts the second donor mask into the second mask deposition chamber 233, a gate 233*a* may be opened and the second donor mask may be put into the second mask deposition chamber 233. Here, since the inner region of the second transfer chamber 210 maintains the pre-set vacuum level before the gate 233*a* is opened, the inner region of the second mask deposition chamber 233 almost maintains the pre-set vacuum level even when the gate 233*a* opens.

After the deposition layer is deposited on the deposition surface of the second donor mask in the second mask deposition chamber 233, the second donor mask is again discharged into the second transfer chamber 210 by the second transfer robot 212. At this time as well, the gate 233*a* is opened and then closed. Other gates 231*a*, 232*a*, and 234*a* may have the similar or same function as the gate 233*a*.

One side of the second substrate deposition chamber 240 in a −x direction is connected to the first transfer chamber 110 and another side of the second substrate deposition chamber 240 in a +x direction is connected to the second transfer chamber 210.

The second donor mask in the second transfer chamber 210 may be put into the second substrate deposition chamber 240 by the second transfer robot 212. At this time, a gate 240*a* may be opened and closed. Then, the substrate 10 is put into the second substrate deposition chamber 240 while the deposition surface of the substrate 10 faces upward. At this time, a gate 240*b* may be opened and closed. The substrate 10 may be put into the second substrate deposition chamber 240 by the first transfer robot 112.

Here, the substrate 10 may be put into the second substrate deposition chamber 240 after the second donor mask is put into the second substrate deposition chamber 240, or the second donor mask may be put into the second substrate deposition chamber 240 after the substrate 10 is put into the second substrate deposition chamber 240. Alternatively, the second donor mask and the substrate 10 may be simultaneously put into the second substrate deposition chamber 240.

As such, when the substrate 10 and the second donor mask are put into the second substrate deposition chamber 240, the second donor mask is above the substrate 10 while the deposition layer of the second donor mask faces downward (−z direction) and the deposition surface of the substrate 10 faces upward (+z direction).

Then, the second substrate deposition chamber 240 mutually aligns the second donor mask and the substrate 10. In embodiments, the substrate 10 and the second donor mask are aligned such that a transmission area of a reflection layer of the second donor mask corresponds to a pre-set area of the substrate 10. Since the deposition layer of the second donor mask contains a green emission material, the substrate 10 and the second donor mask are aligned such that a through hole of the reflection layer of the second donor mask corresponds to the pixel electrode 21 of a green sub-pixel G.

Then, the second substrate deposition chamber 240 deposits, on the deposition surface of the substrate 10, a part of the deposition or donor layer of the second deposition material on the deposition surface of the second donor mask. In detail, the part of the deposition layer of the second donor mask is transferred to the substrate 10 by emitting a lamp light or a laser beam to the second donor mask by using a flash lamp or a laser beam generator. Since details thereof are the same and/or similar to those described above with respect to depositing the part of the deposition layer 34 of the first donor mask 30 on the substrate 10, the details thereof are not provided here.

Then, the second transfer robot 212 discharges the second donor mask from the second substrate deposition chamber 240 and puts the second donor mask into the second mask stack 220. The second donor mask used as such may be washed in a washing chamber 224, tested in a test chamber 222 as occasion demands, and then put into the second mask stack 220 again to be re-used. Here, the second donor mask may be re-used by, as described above, forming the deposition layer on the second donor mask and then depositing the part of the deposition layer on the substrate 10.

Meanwhile, the substrate 10 on which the green light emission layer is deposited may also be discharged from the second substrate deposition chamber 240 to the second transfer chamber 210 by the second transfer robot 212, and then put into the third deposition cluster 300. In detail, the substrate 10 may be put into a third substrate deposition chamber 340 of the third deposition cluster 300. At this time, the substrate 10 moves while the deposition surface of the substrate 10 faces upward (+z direction).

The third deposition cluster 300 includes a third mask stack 320, a plurality of third mask deposition chambers 331, 332, 333, 334, the third substrate deposition chamber 340, and a third transfer chamber 310 that is located approximately at the center of the third deposition cluster 300 and is connected to the third mask stack 320, the plurality of third mask deposition chambers 331, 332, 333, 334, and the third substrate deposition chamber 340. The third transfer chamber 310 may include a third transfer robot 312 having an end-effector. The third transfer robot 312 may discharge a third donor mask accommodated in the third mask stack 320 or put the third donor mask into the third mask stack 320, put or discharge the third donor mask into or from the third mask deposition chambers 331, 332, 333, 334 and the third substrate deposition chamber 340, and discharge the substrate 10 from the third substrate deposition chamber 340.

The third mask stack 320 may accommodate a plurality of the third donor masks. A structure of the third donor mask accommodated in the third mask stack 320 may be the same and/or similar to that of the first donor mask 30 described above. The third donor mask may be accommodated in the third mask stack 320 while a deposition surface of the third donor mask faces downward.

The third donor mask accommodated in the third mask stack 320 may be discharged by the third transfer robot 312 and put into any one of the third mask deposition chambers 331, 332, 333, 334. As occasion demands, a gate 320*a* may exist between the third mask stack 320 and the third transfer chamber 310. Since descriptions about the gate 320*a* are the same and/or similar to that about the gate 220*a*, details thereof are not provided here.

The third transfer robot 312 puts the third donor mask discharged from the third mask stack 320 into any one of the third mask deposition chambers 331, 332, 333, 334. For example, the third transfer robot 312 may put the third donor mask into the third mask deposition chamber 333.

At this time, the third donor mask is not turned. Thus, in the third donor mask put into the third mask deposition chamber 333, a base substrate is located at the top and a photothermal converting layer is located at the bottom. In embodiments, it is possible that the third deposition cluster does not include any device configured to turn the first donor mask over.

The third mask deposition chambers 331, 332, 333, 334 may deposit a third deposition material to form a deposition layer or a donor layer on the deposition surface of the third donor mask, for example, a surface of the photothermal converting layer, which is opposite to a surface facing the base substrate. In embodiments, the deposition layer may be formed on the deposition surface of the third donor mask by using a deposition source located below the third donor mask while the deposition surface of the third donor mask faces downward. The third mask deposition chambers 331, 332, 333, 334 may form the deposition layer on the third donor mask while inner regions of the third mask deposition chambers 331, 332, 333, 334 are in a state having a pre-set vacuum level. At this time, the deposition layer may be a blue light emission layer.

When the third transfer robot 312 puts the third donor mask into the third mask deposition chamber 333, a gate 333*a* may be opened and the third donor mask may be put into the third mask deposition chamber 333. Here, since the inner region of the third transfer chamber 310 maintains the pre-set vacuum level before the gate 333*a* is opened, the inner region of the third mask deposition chamber 333 almost maintains the pre-set vacuum level even when the gate 333*a* opens.

After the deposition layer is deposited on the deposition surface of the third donor mask in the third mask deposition chamber 333, the third donor mask is again discharged into the third transfer chamber 310 by the third transfer robot 312. At this time as well, the gate 333*a* is opened and then closed. Other gates 331*a*, 332*a*, and 334*a* may have the similar or same function as the gate 333*a*.

One side of the third substrate deposition chamber 340 in a −x direction is connected to the second transfer chamber 210 and another side of the third substrate deposition chamber 340 in a +x direction is connected to the third transfer chamber 310.

The third donor mask in the second transfer chamber 310 may be put into the third substrate deposition chamber 340 by the third transfer robot 312. At this time, a gate 340*a* may be opened and closed. Then, the substrate 10 is put into the third substrate deposition chamber 340 while the deposition surface of the substrate 10 faces upward. At this time, a gate 340*b* may be opened and closed. The substrate 10 may be put into the third substrate deposition chamber 340 by the second transfer robot 212.

Here, the substrate 10 may be put into the third substrate deposition chamber 340 after the third donor mask is put into the third substrate deposition chamber 340, or the third donor mask may be put into the third substrate deposition chamber 340 after the substrate 10 is put into the third substrate deposition chamber 340. Alternatively, the third donor mask and the substrate 10 may be simultaneously put into the third substrate deposition chamber 340.

As such, when the substrate 10 and the third donor mask are put into the third substrate deposition chamber 340, the third donor mask is above the substrate 10 while the deposition layer of the third donor mask faces downward (−z direction) and the deposition surface of the substrate 10 faces upward (+z direction).

Then, the third substrate deposition chamber 340 mutually aligns the third donor mask and the substrate 10. In embodiments, the substrate 10 and the third donor mask are aligned such that a transmission area of a reflection layer of the third donor mask corresponds to a pre-set area of the substrate 10. Since the deposition layer of the third donor mask contains a blue emission material, the substrate 10 and the third donor mask are aligned such that a through hole of the reflection layer of the third donor mask corresponds to the pixel electrode 21 of a blue sub-pixel B.

Then, the third substrate deposition chamber 340 deposits, on the deposition surface of the substrate 10, a part of the deposition or donor layer of the third deposition material on the deposition surface of the third donor mask. In detail, the part of the deposition layer of the third donor mask is transferred to the substrate 10 by emitting a lamp light or a laser beam to the third donor mask by using a flash lamp or a laser beam generator. Since details thereof are the same and/or similar to those described above with respect to depositing the part of the deposition layer 34 of the first donor mask 30 on the substrate 10, the details thereof are not provided here.

Then, the third transfer robot 312 discharges the third donor mask from the third substrate deposition chamber 340 and puts the third donor mask into the third mask stack 320. The third donor mask used as such may be washed in a washing chamber 324, tested in a test chamber 322 as occasion demands, and then put into the third mask stack 320 again to be re-used. Here, the third donor mask may be re-used by, as described above, forming the deposition layer on the third donor mask and then depositing the part of the deposition layer on the substrate 10.

Meanwhile, the substrate 10 on which the blue light emission layer is deposited may also be discharged from the third substrate deposition chamber 340 to the third transfer chamber 310 by the third transfer robot 312, and then put into the second substrate turning chamber 420. Here, the substrate 10 moves while the deposition surface of the substrate 10 faces upward (+z direction).

When the substrate 10 is put into the second substrate turning chamber 420 as such, the second substrate turning chamber 420 turns the substrate 10 such that the deposition surface of the substrate 10 faces downward (−z direction). When the second substrate turning chamber 420 turns the substrate 10, an inner region of the second substrate turning chamber 420 may be in an atmospheric state or a state having a pre-set vacuum level. In any cases, the inner region of the second substrate turning chamber may be blocked from an outer region through the gates 420a and 420b of the second substrate turning chamber 420.

The second substrate turning chamber 420 turns the substrate 10 because a layer that is integrally formed with respect to the entire pixels needs to be formed on the emission layer or the pixel-defining film 18 after the red light emission layer, the green light emission layer, and/or the blue light emission layer are deposited on the substrate 10. Such a layer that is integrally formed with respect to the entire pixels may be referred to as a second auxiliary layer, and the second auxiliary layer may be an electron transport layer (ETL), an electron injection layer (EIL), and/or a counter electrode.

The second auxiliary layer may be formed via a deposition, and at this time, the second auxiliary layer may be deposited while a deposition source discharging a material for forming the second auxiliary layer is located at the bottom, the substrate 10 is located above the deposition source, and the deposition surface of the substrate 10 faces the deposition source. Thus, after the emission layer or the like are deposited, the second substrate turning chamber 420 may turn the substrate 10.

The deposition apparatus according to the current embodiment turns the substrate 10 only once before and after the emission layer is formed. Then, the emission layer is formed without having to turn the substrate 10 or the first through third donor masks. Thus, the emission layer may be quickly formed.

Of course, the substrate 10 may not be turned and may pass through the first through third deposition clusters 100, 200, 300 while the deposition surface of the substrate 10 faces downward (−z direction). In this case, a deposition layer may be deposited on a donor mask while a deposition surface of the donor mask faces downward (−z direction), and then the donor mask may be turned so that the donor mask is located below the substrate 10 and a pre-set area of the deposition layer of the donor mask may be deposited on the substrate 10.

However, in this case, each of the first through third deposition clusters 100, 200, 300 needs to include a mask turning chamber. Thus, the number of turning chambers increases compared to when the substrate 10 is turned, and accordingly, a space required for the deposition apparatus increases. In detail, the red light emission layer, the green light emission layer, and the blue light emission layer are formed in the above description, but if a patterned layer, such as a red auxiliary layer and/or a green auxiliary layer, needs to be formed, a deposition cluster for forming the patterned layer is additionally required, and thus the number of turning chambers may be further increased.

However, according to the deposition apparatus of the current embodiment, even if the number of deposition clusters increases, only two turning chambers, in the illustrated embodiment, the first substrate turning chamber 410 and the second substrate turning chamber 420, are required, and thus the structure of the deposition apparatus may be simplified and manufacturing costs of the deposition apparatus may be reduced. Moreover, since a donor mask is not turned, a manufacturing speed of an OLED apparatus may be increased.

The deposition apparatus according to the current embodiment includes the first through third deposition clusters 100, 200, 300, the first substrate turning chamber 410, and the second substrate turning chamber 420, but the deposition apparatus is not limited thereto. For example, the deposition apparatus may further include a deposition cluster between the first and second substrate turning chambers 410 and 420. Also, the deposition apparatus may further include a first auxiliary layer deposition chamber for depositing the first auxiliary layer or a first auxiliary layer deposition cluster including the first auxiliary deposition chamber, which is connected to the first substrate turning chamber 410. In addition, the deposition apparatus may further include a second auxiliary layer deposition chamber for depositing the second auxiliary layer or a second auxiliary layer deposition cluster including the second auxiliary deposition chamber, which is connected to the second substrate turning chamber 420.

The first through third deposition clusters 100, 200, 300 each include a plurality of mask deposition chambers, but alternatively, the first through third deposition clusters 100, 200, 300 may each include one mask deposition chamber.

Figure 6:
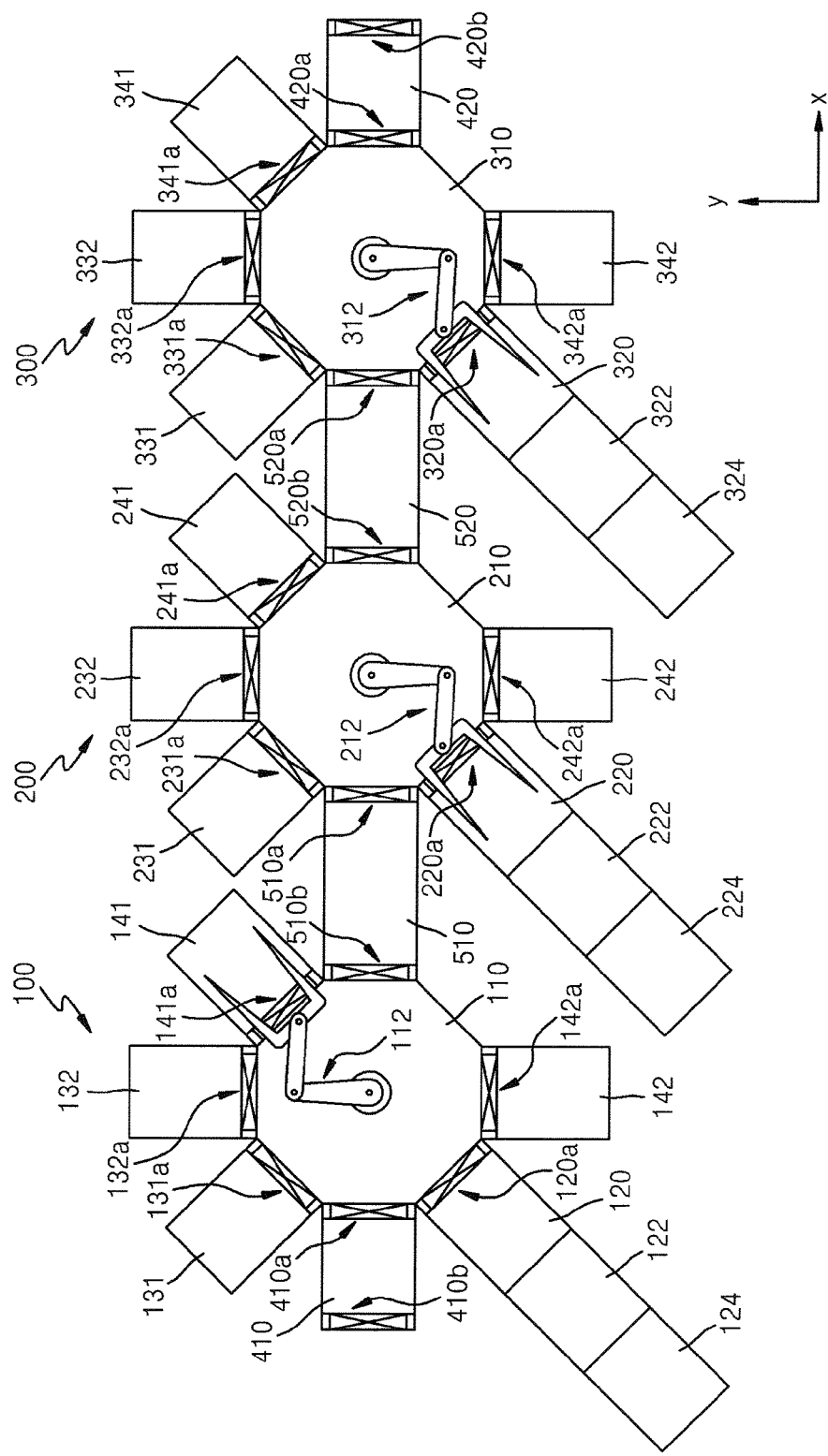
FIG. 6 is a plan view schematically illustrating a deposition apparatus according to another embodiment of the present invention.

FIG. 6 is a plan view schematically illustrating a deposition apparatus according to another embodiment of the present invention. As shown in FIG. 6, the first deposition cluster 100 may include a plurality of first substrate deposition chambers 141 and 142. In this case, the first substrate deposition chambers 141 and 142 may be connected to the first transfer chamber 110 respectively through gates 141a and 142a. Also, the first substrate turning chamber 410 may be connected to the first transfer chamber 110 of the first deposition cluster 100.

The second deposition cluster 200 may also include a plurality of second substrate deposition chambers 241 and 242. In this case, the second substrate deposition chambers 241 and 242 may be connected to the second transfer chamber 210 respectively through gates 241a and 242a. Also, the first transfer chamber 110 and the second transfer chamber 210 may be connected to each other through a first connection chamber 510. The first connection chamber 510 may be connected to the first and second transfer chambers 110 and 210 respectively through gates 510a and 510b.

The third deposition cluster 300 may also include a plurality of third substrate deposition chambers 341 and 342. In this case, the third substrate deposition chambers 341 and 342 may be connected to the third transfer chamber 310 respectively through gates 341a and 342a. Also, the second and third transfer chambers 210 and 310 may be connected to each other through a second connection chamber 520. The second connection chamber 520 may be connected to the second and third transfer chambers 210 and 310 respectively through gates 520a and 520b. Also, the second substrate turning chamber 420 may be connected to the third transfer chamber 310 of the third deposition cluster 300.

According to the deposition apparatus of the current embodiment, each of the first through third deposition clusters 100, 200, 300 may simultaneously perform deposition on two substrates.

Figure 7:
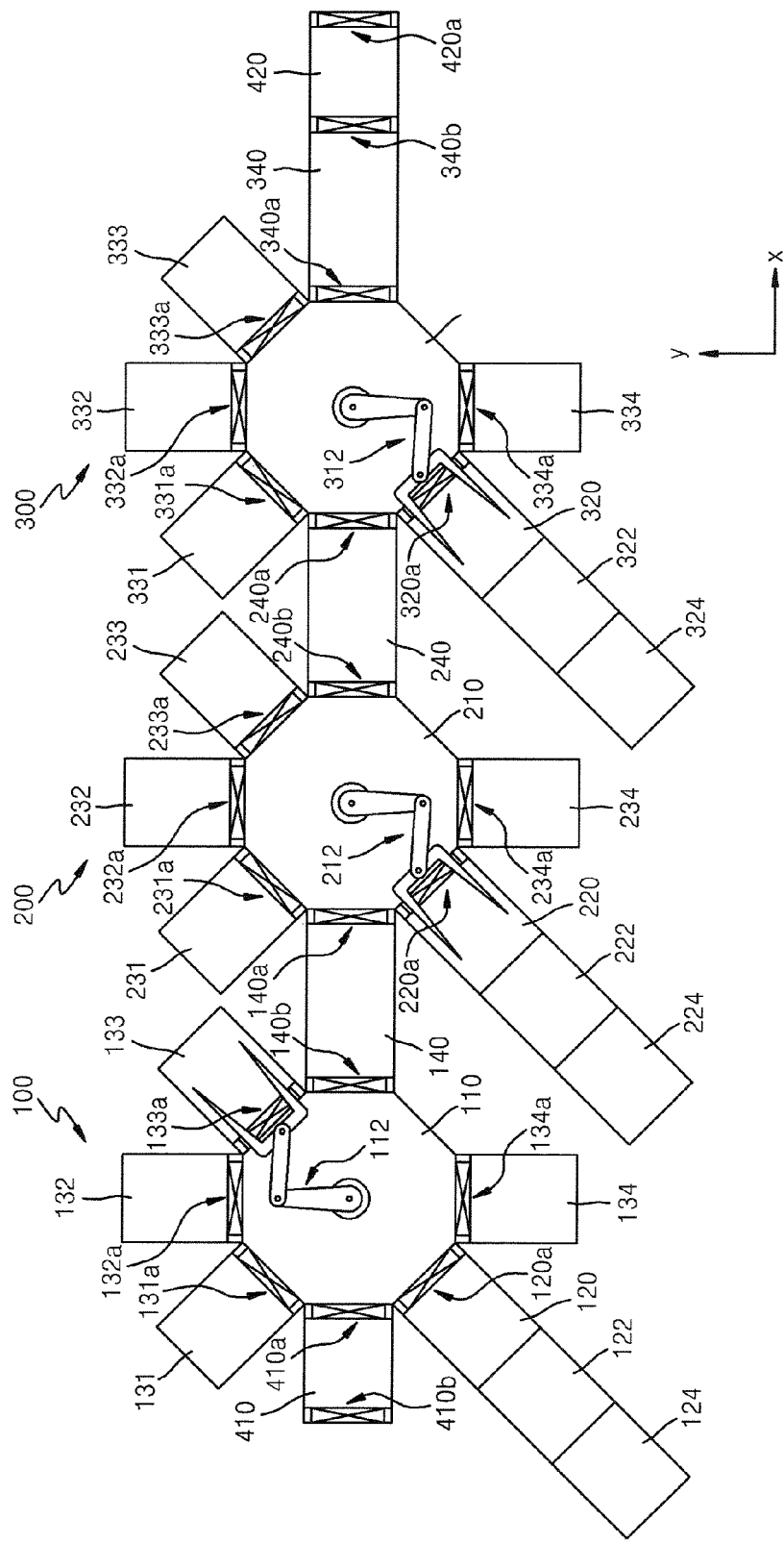
FIG. 7 is a plan view schematically illustrating a deposition apparatus according to another embodiment of the present invention.

FIG. 7 is a plan view schematically illustrating a deposition apparatus according to another embodiment of the present invention. As shown in FIG. 7, in the deposition apparatus according to the current embodiment, the first substrate turning chamber 410 may be connected to the first transfer chamber 110 of the first deposition cluster 100. Also, one side of the first substrate deposition chamber 140 in the −x direction may be connected to the first transfer chamber 110 and another side of the first substrate deposition chamber 140 in the +x direction may be connected to the second transfer chamber 210 of the second deposition cluster 200. Accordingly, the first substrate deposition chamber 140 may include the gates 140a and 140b. One side of the second substrate deposition chamber 240 of the second deposition cluster 200 in the −x direction may be connected to the second transfer chamber 210 and the other side of the second substrate deposition chamber 240 in the +x direction may be connected to the third transfer chamber 310 of the third deposition cluster 300. Accordingly, the second substrate deposition chamber 240 may include the gates 240a and 240b. One side of the third substrate deposition chamber 340 in the −x direction may be connected to the third transfer chamber 310 and the other side of the third substrate deposition chamber 340 in the +x direction may be connected to the second substrate turning chamber 420. Accordingly, the third substrate deposition chamber 340 may include the gate 340a in a direction of the third transfer chamber 310 and the gate 340b in a direction of the second substrate turning chamber 420.

The deposition apparatus has been described above, but embodiments of the present invention are not limited thereto. For example, an embodiment of the present invention may provide a method of manufacturing an OLED apparatus by using the deposition apparatus.

According to the method of an embodiment of the present invention, a substrate is turned such that a deposition surface of the substrate faces upward. Then, a first deposition layer is deposited on a deposition surface of a first donor mask while the deposition surface of the first donor mask faces downward, and the first donor mask and the substrate are mutually aligned while the first donor mask is above the substrate while the first deposition layer faces downward and the deposition surface of the substrate faces upward. Next, a pre-set part of the first deposition layer on the deposition surface of the first donor mask is deposited on the deposition surface of the substrate, and then the substrate is turned such that the deposition surface of the substrate faces downward. Here, before the substrate is turned such that the deposition surface of the substrate faces downward, a second deposition layer and a third deposition layer may be formed respectively on a second donor mask and a third donor mask, a pre-set part of the second deposition layer may be deposited on the substrate while the second donor mask is disposed above the substrate, and a pre-set part of the third deposition layer may be deposited on the substrate while the third donor mask is disposed above the substrate.

Here, a pre-set part of a deposition layer of a donor mask may be deposited on a surface of a substrate, which faces upward, by emitting a laser beam or a flash lamp light to one of two surfaces of the donor mask, which is far from the deposition layer.

Before turning the substrate such that the deposition surface of the substrate faces upward, a first auxiliary layer or pre-deposited layer may be deposited on the deposition surface of the substrate by using a deposition source disposed below the substrate while the deposition surface of the substrate faces downward, and after turning the substrate such that the deposition surface of the substrate faces downward, a second auxiliary layer may be deposited on the deposition surface of the substrate by using a deposition source disposed below the substrate while the deposition surface of the substrate faces downward.

According to the method of the current embodiment, since the substrate is turned twice while manufacturing the OLED apparatus, the OLED apparatus may be quickly manufactured. If a donor mask is turned without turning the substrate, the donor mask needs to be turned whenever a patterned layer is formed, and thus the donor mask is turned at least three times in order to form a red light emission layer, a green light emission layer, and a blue light emission layer, and at least 5 times if a red auxiliary layer and a green auxiliary layer are further formed. However, according to the method of the current embodiment, the substrate is turned only twice to form the OLED apparatus.

As described above, according to one or more embodiments of the present invention, the deposition apparatus and the method of manufacturing an OLED apparatus may have reduced manufacturing time and reduced manufacturing costs of the OLED apparatus.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:
providing a light emission material deposition apparatus comprising an inlet gate, an outlet gate, a first deposition cluster, and a second deposition cluster, the first deposition cluster and the second deposition cluster being disposed between the inlet gate and the outlet gate, the light emission material deposition apparatus further comprising a first turning chamber disposed between the inlet gate and the first deposition cluster and a second turning chamber disposed between the second deposition cluster and the outlet gate;

fabricating an intermediate product comprising a substrate and a pre-deposition layer, the substrate comprising a first surface facing downward and a second surface facing upward, the pre-deposition layer formed over the first surface;

subsequent to fabricating, supplying the intermediate product to the first turning chamber through the inlet gate while the first surface of the substrate faces downward;

turning the substrate over in the first turning chamber such that the first surface of the substrate faces upward;

subsequent to turning over, supplying the intermediate product to the first deposition cluster while the first surface of the substrate faces upward;

depositing, in the first deposition cluster, a first organic light emission deposition material on a deposition surface of a first donor mask while the deposition surface of the first donor mask faces downward, thereby forming a first donor layer on the deposition surface of the first donor mask;

arranging, in the first deposition cluster, the first donor mask and the substrate such that the first donor mask is disposed above the substrate while the deposition surface of the first donor mask faces downward and the first surface of the substrate faces upward;

transferring, in the first deposition cluster, over the first surface of the substrate, at least part of the first organic light emission deposition material of the first donor layer, thereby forming a first deposition layer over the first surface of the substrate;

supplying the intermediate product from the first deposition cluster to the second deposition cluster while the first surface of the substrate faces upward;

depositing, in the second deposition cluster, a second organic light emission deposition material on a deposition surface of a second donor mask while the deposition surface of the second donor mask faces downward, thereby forming a second donor layer on the deposition surface of the second donor mask;

arranging, in the second deposition cluster, the second donor mask and the substrate such that the second donor mask is disposed above the substrate while the deposition surface of the second donor mask faces downward and the first surface of the substrate faces upward;

transferring, in the second deposition cluster, over the first surface of the substrate, at least part of the second organic light emission deposition material of the second donor layer, thereby forming a second deposition layer over the first surface of the substrate;

subsequent to transferring in the second deposition cluster, supplying the intermediate product to the second turning chamber;

turning the substrate back in the second turning chamber such that the first surface of the substrate faces downward before depositing at least one layer on the intermediate product while the first surface faces downward, thereby manufacturing an organic light-emitting display apparatus.

2. The method of claim 1, wherein, at any time after depositing and before transferring, the first donor mask maintains its orientation that the deposition surface of the first donor mask faces downward.

3. The method of claim 1, wherein, at any time after depositing and before transferring, the first donor mask is not turned over.

4. The method of claim 1, wherein once turning the substrate over such that the first surface of the substrate faces upward, the substrate is not turned over until turning the substrate back such that the first surface of the substrate faces downward.

5. The method of claim 1, wherein the first deposition layer comprises an array of organic light emitting layer portions.

6. The method of claim 1, wherein depositing in the first deposition cluster comprises transmitting the first organic light emission deposition material from a first organic light emission deposition material source located under the first donor mask toward the deposition surface of the first donor mask.

7. The method of claim 1, wherein transferring in the first deposition cluster comprises emitting a laser beam or a flash lamp light to a surface of the first donor mask, which is opposite to the deposition surface of the first donor mask, to transfer the at least part of the first deposit material of the first donor layer over the first surface of the substrate.

8. The method of claim 1, wherein, at any time after depositing in the second deposition cluster and before transferring in the second deposition cluster, the second donor mask maintains its orientation that the deposition surface of the second donor mask faces downward.

9. The method of claim 1, wherein, at any time after depositing in the second deposition cluster and before transferring in the second deposition cluster, the second donor mask is not turned over.

10. The method of claim 1, wherein the first deposition layer comprises a first array of organic light emitting layer portions configured to emit light of a first color, wherein the second deposition layer comprises a second array of organic light emitting layer portions configured to emit light of a second color different from the first color.

* * * * *